United States Patent
Scanlan

(10) Patent No.: US 12,394,638 B2
(45) Date of Patent: Aug. 19, 2025

(54) FLUID ROUTING FOR A VACUUM PUMPING SYSTEM

(71) Applicant: Edwards Limited, Burgess Hill (GB)

(72) Inventor: Declan Scanlan, Dublin (IE)

(73) Assignee: Edwards Limited, Burgess Hill (GB)

(*) Notice: Subject to any disclaimer, the term of this patent is extended or adjusted under 35 U.S.C. 154(b) by 49 days.

(21) Appl. No.: 18/558,659

(22) PCT Filed: May 6, 2022

(86) PCT No.: PCT/GB2022/051152
§ 371 (c)(1),
(2) Date: Nov. 2, 2023

(87) PCT Pub. No.: WO2022/234288
PCT Pub. Date: Nov. 10, 2022

(65) Prior Publication Data
US 2024/0213042 A1   Jun. 27, 2024

(30) Foreign Application Priority Data
May 7, 2021 (GB) .................................. 2106501

(51) Int. Cl.
*H01L 21/67* (2006.01)
(52) U.S. Cl.
CPC .............................. *H01L 21/67017* (2013.01)
(58) Field of Classification Search
CPC .... H01L 21/67017; G01M 3/02; F04B 37/14; F04B 41/06; F04B 39/10; F04C 25/02; F04C 25/00; F04D 19/042; F04D 17/168
See application file for complete search history.

(56) References Cited

U.S. PATENT DOCUMENTS 5,259,735 A * 11/1993 Takahashi ................ B01J 3/006
                                                                417/205
6,736,606 B1 * 5/2004 Ohmi ....................... F04D 25/00
                                                                417/244
(Continued)

FOREIGN PATENT DOCUMENTS

DE       202012002684 U1   6/2013
DE       102015222213 A1   5/2017
(Continued)

OTHER PUBLICATIONS

British Examination Report dated Oct. 1, 2021 and Search Report dated Sep. 30, 2021 for corresponding British Application No. GB2106501.6, 4 pages.
(Continued)

*Primary Examiner* — Jessica Cahill
(74) *Attorney, Agent, or Firm* — Theodore M. Magee; Westman, Champlin & Koehler, P.A.

(57) ABSTRACT

A fluid routing module for a vacuum pumping system, the fluid routing module comprising: a first fluid inlet; a second fluid inlet; a fluid outlet; a first fluid line coupled between the first fluid inlet and the fluid outlet; a second fluid line coupled between the second fluid inlet and the fluid outlet; a first restrictor configured to restrict a flow of the fluid therethrough, the first restrictor being disposed along the first fluid line; a vacuum pump disposed along the second fluid line; and one or more valves configured to selectably direct a fluid flow through either the first fluid line or the second fluid line.

14 Claims, 3 Drawing Sheets

(56) References Cited

U.S. PATENT DOCUMENTS

| | | | | |
|---|---|---|---|---|
| 7,082,813 | B2* | 8/2006 | Grosse-Bley | G01M 3/202 |
| | | | | 73/40.7 |
| 8,382,909 | B2* | 2/2013 | Aitchison | C23C 16/52 |
| | | | | 134/37 |
| 2006/0034715 | A1* | 2/2006 | Boger | F04D 27/0269 |
| | | | | 417/423.4 |
| 2007/0079758 | A1* | 4/2007 | Holland | F04D 27/0253 |
| | | | | 422/112 |
| 2013/0071274 | A1* | 3/2013 | Galtry | F04C 2/00 |
| | | | | 418/5 |
| 2016/0166745 | A1* | 6/2016 | Aalders | A61M 39/24 |
| | | | | 604/74 |
| 2016/0223424 | A1* | 8/2016 | Hilgers | G01L 19/0654 |
| 2017/0200622 | A1* | 7/2017 | Shiokawa | C23C 16/52 |
| 2018/0328809 | A1* | 11/2018 | Bruhns | G01M 3/205 |

FOREIGN PATENT DOCUMENTS

| | | | |
|---|---|---|---|
| EP | 0898083 | A2 | 2/1999 |
| JP | 2000340115 | A * | 12/2000 |
| WO | 2014012896 | A2 | 1/2014 |
| WO | 2020109790 | A1 | 6/2020 |

OTHER PUBLICATIONS

PCT Notification of Transmittal of the International Search Report and the Written Opinion of the International Searching Authority, or the Declaration and PCT Search Report dated Jun. 30, 2022 for corresponding PCT application Serial No. PCT/GB2022/051152, 10 pages.

* cited by examiner

FLUID ROUTING FOR A VACUUM PUMPING SYSTEM

CROSS-REFERENCE OF RELATED APPLICATION

This application is a Section 371 National Stage Application of International Application No. PCT/GB2022/051152, filed May 6, 2022, and published as WO 2022/234288A1 on Nov. 10, 2022, the content of which is hereby incorporated by reference in its entirety and which claims priority of British Application No. 2106501.6, filed May 7, 2021.

FIELD

The present invention relates to fluid routing for use with vacuum pumping systems, including but not limited to vacuum systems for pumping fluids from semiconductor processing tool.

BACKGROUND

Semiconductor fabrication plants fabricate integrated circuit chips. In the fabrication of such devices, wafers are processed through a number of different processing stations, including stations at which the wafer undergoes, for example, chemical vapor deposition, physical vapor deposition, implant, etch and lithography processes. Many of these processes involve the use of a gaseous ambient and often require the use of high vacuum and reduced gas pressures.

Vacuum pumps are used to provide these reduced gas pressures in process chambers, provide chamber evacuation, and maintain flows of processing gases.

The discussion above is merely provided for general background information and is not intended to be used as an aid in determining the scope of the claimed subject matter. The claimed subject matter is not limited to implementations that solve any or all disadvantages noted in the background.

SUMMARY

When the pressure inside a chamber of a semiconductor processing tool is not at working vacuum, for example after a process chamber has been vented to atmospheric pressure to enable service or maintenance, a so-called "pump-down event" is performed to establish the required reduced gas pressure in the chamber. A pump-down event involves pumping gas from the chamber so as to reduce the pressure therein to the required level.

Similarly, when the pressure inside a pumping chamber of a vacuum pump (e.g., a turbopump) is at atmospheric pressure, for example after the vacuum pump has been deactivated to enable service or maintenance, a pump-down event is performed to establish a reduced gas pressure in the pumping chamber of that vacuum pump.

Vacuum and abatement systems may be used to pump gas from multiple process chambers of a semiconductor processing tool simultaneously using a common pump via a common manifold. The present inventors have realised that in such systems, because multiple chambers and/or multiple turbopumps may be fluidly connected to a common manifold, performing a pump-down event for one of those chambers and/or turbopumps may affect the conditions within others of those chambers. For example, a pump-down event performed on one chamber may cause highly undesirable fluctuations in other chambers connected to the same manifold.

Aspects of the present invention provide a valve module for controlling fluid from multiple chambers of a semiconductor processing tool in such a way that these deficiencies are reduced or eliminated.

In a first aspect, there is provided a fluid routing module for a vacuum pumping system, the fluid routing module comprising: a first fluid inlet; a second fluid inlet; a fluid outlet; a first fluid line coupled between the first fluid inlet and the fluid outlet; a second fluid line coupled between the second fluid inlet and the fluid outlet; a first restrictor configured to restrict a flow of the fluid therethrough, the first restrictor being disposed along the first fluid line; a vacuum pump disposed along the second fluid line; and one or more valves configured to selectably direct a fluid flow through either the first fluid line or the second fluid line.

The one or more valves may comprise a first valve and a second valve. The first valve may be disposed along the first fluid line. The second valve may be disposed along the first fluid line.

The fluid routing module may comprise: a second restrictor configured to restrict a flow of the fluid therethrough, the second restrictor being disposed along the second fluid line; a bypass line arranged in parallel with the second restrictor whereby to allow a flow of fluid to bypass the second restrictor; and one or more further valves configured to selectably direct a fluid flow through either the second restrictor or the bypass line. The second restrictor and the bypass line may be disposed along the second fluid line between the vacuum pump and the fluid outlet. The one or more further valves may comprise a three-way valve disposed between the vacuum pump and the second restrictor and the bypass line.

The vacuum pump may be a turbopump.

The fluid routing module may further comprise a valve controller configured to control operation of the one or more valves.

The fluid routing module may further comprise: one or more further first fluid inlet; one or more further second fluid inlets; one or more further fluid outlets; one or more further first fluid lines, each further first fluid line coupled between a respective further first fluid inlet and a further fluid outlet; one or more further second fluid lines, each further second fluid line coupled between a respective second fluid inlet and a further fluid outlet; one or more further first restrictors configured to restrict a flow of the fluid therethrough, each further first restrictor being disposed along a respective further first fluid line; one or more further vacuum pumps, each further vacuum pump being disposed along a respective further second fluid line; and one or more further valves configured to selectably direct a fluid flow through either a further first fluid line or a further second fluid line.

The fluid routing module may further comprise a fluid line manifold. The fluid outlet and/or the one or more further fluid outlets may be fluidly coupled to the fluid line manifold.

In a further aspect, there is provided a system comprising: a semiconductor processing tool comprising a processing chamber; the fluid routing module of any preceding aspect, wherein the first fluid inlet and the second fluid inlet are fluidly coupled to the processing chamber; and a pump operatively coupled to the fluid outlet.

The semiconductor processing tool may further comprise one or more further processing chambers. The system may further comprise one or more further fluid routing modules, each further fluid routing modules being a fluid routing module in accordance with any preceding aspect, wherein the first fluid inlet and the second fluid inlet of each further fluid routing module are fluidly coupled to a respective further processing chamber. The system may further comprise a fluid line manifold, wherein the fluid outlet of the fluid routing module and each of the fluid routing modules are fluidly coupled to the fluid line manifold. The pump may be operatively coupled to the fluid line manifold.

In a further aspect, there is provided a method for operating a fluid routing module for a vacuum pumping system. The fluid routing module is in accordance with preceding aspect. The method comprises: controlling the one or more valves to direct a fluid flow through the first fluid line and to prevent or oppose fluid flow through the second fluid line; and, responsive to one or more conditions being satisfied, controlling the one or more valves to allow a fluid flow through the second fluid line and to prevent or oppose fluid flow through the first fluid line, and pumping, by the vacuum pump, the fluid through the second fluid line.

The one or more conditions may comprise a condition that a pressure in a chamber fluidly coupled to the first fluid input and the second fluid inlet is below a first threshold pressure.

The method may further comprise: controlling the one or more further valves to direct a fluid flow through the second restrictor and to prevent or oppose fluid flow through the bypass line; and, responsive to one or more further conditions being satisfied, controlling the one or more further valves to allow a fluid flow through the bypass line and to prevent or oppose fluid flow through the second restrictor. The one or more further conditions may comprise a condition that a pressure in a pumping chamber of the vacuum pump is below a second threshold pressure.

The Summary is provided to introduce a selection of concepts in a simplified form that are further described in the Detailed Description. This summary is not intended to identify key features or essential features of the claimed subject matter, nor is it intended to be used as an aid in determining the scope of the claimed subject matter.

DETAILED DESCRIPTION

Figure 1:
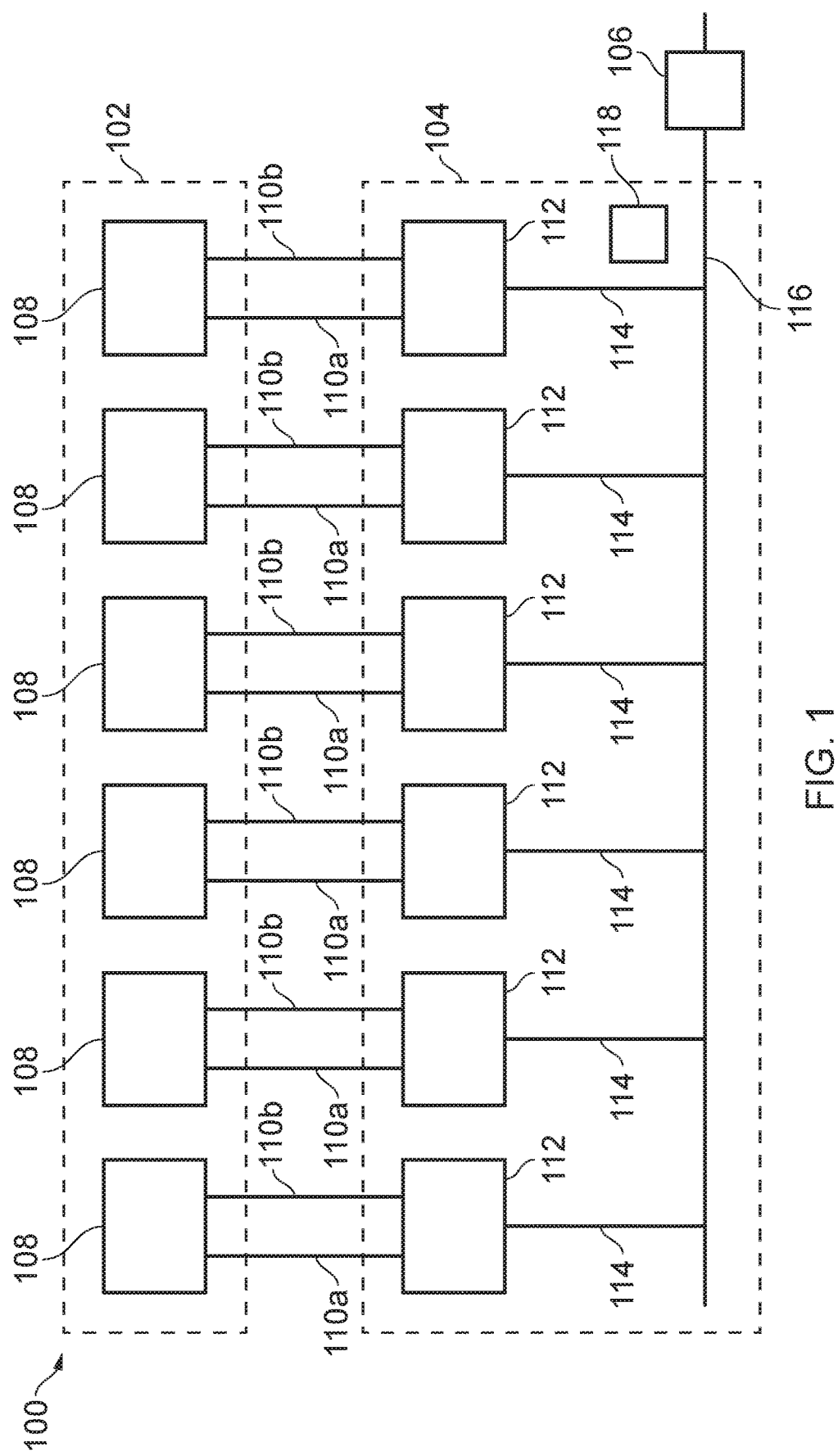
FIG. 1 is a schematic illustration (not to scale) of a semiconductor fabrication facility.

FIG. 1 is a schematic illustration (not to scale) of a semiconductor fabrication facility 100, in accordance with an embodiment.

The semiconductor fabrication facility 100 comprises a semiconductor processing tool 102, a fluid routing module 104, and a vacuum pump 106.

The semiconductor processing tool 102 comprises a plurality of process chambers 108 in which semiconductor wafers undergo respective processes. Examples of such processes include, but are not limited to, chemical vapor deposition, physical vapor deposition, implant, etch and lithography processes.

The vacuum pump 106 is configured to pump fluids (i.e. process gases) out of the process chambers 108 of the semiconductor processing tool 102 via the fluid routing module 104.

The fluid routing module 104 comprises a plurality of inlets, in particular a plurality of first inlets 110a and a plurality of second inlets 110b, a plurality of pumping modules 112, a plurality of pumping module outlets 114, and a fluid line manifold 116.

A respective pair of first and second inlets 110a, 110b is fluidly connected between a respective process chamber 108 and a respective pumping module 112, such that fluid may flow from that process chamber 108 to that pumping module 112 via either or both of those first and second inlets 110a, 110b.

The pumping modules 112 will be described in more detail later below with reference to FIG. 2.

Each pumping module 112 is fluidly connected to the fluid line manifold 116 by a respective pumping module outlet 114, such that fluid may flow from the pumping module 112 to the fluid line manifold 116.

The fluid line manifold 116 is fluidly connected between the plurality of pumping module outlets 114 and the vacuum pump 106.

The fluid routing module 104 further comprises a valve controller 118.

The valve controller 118 is operatively coupled, via respective pneumatic lines and/or electrical connections (not shown), to each of a plurality of valves comprised in the pumping modules 112. These valves are described in more detail later below with reference to FIG. 2. As described in more detail later below with reference to FIG. 3, the valve controller 118 is configured to control operation of the valves of the pumping modules 112, for example by transferring pneumatic fluid thereto via pneumatic lines.

Figure 2:
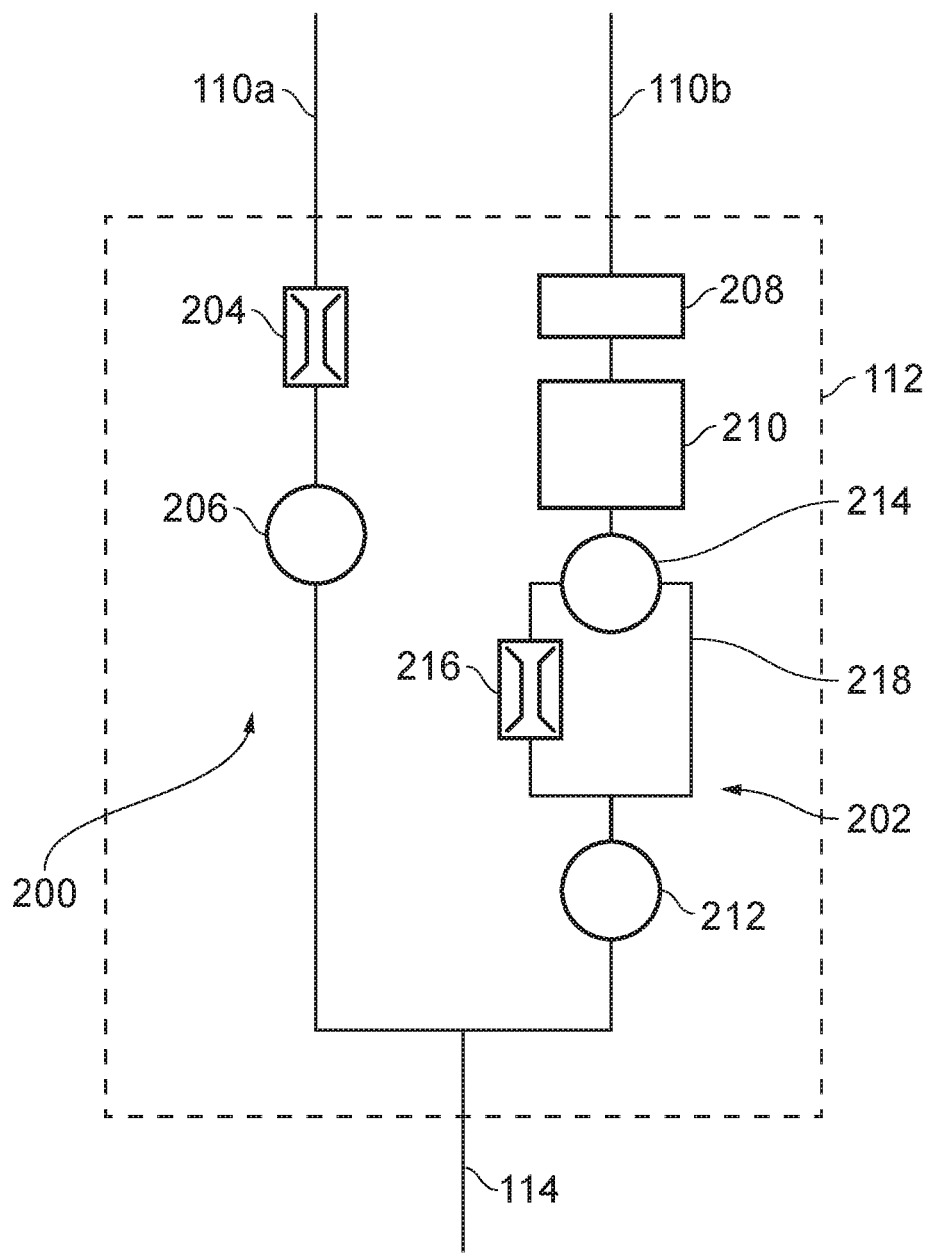
FIG. 2 is a schematic illustration (not to scale) showing further details of a pumping module of the semiconductor fabrication facility.

FIG. 2 is a schematic illustration (not to scale) showing further details of a pumping module 112. In this embodiment, the pumping modules 112 of the fluid routing module 104 are substantially the same as each other.

In this embodiment, the first inlet 110a and the second inlet 110b are fluid inlets of the pumping module 112. Also, the pumping module outlet 114 is a fluid outlet of the pumping module 112.

The pumping module 112 comprises a first fluid line 200 coupled between the first inlet 110a and the pumping module outlet 114, and a second fluid line 202 coupled between the second inlet 110b and the pumping module outlet 114.

The pumping module 112 further comprises a first restrictor 204 and a first valve 206, both disposed along the first fluid line 200. The first restrictor 204 is arranged between the first inlet 110a and the first valve 206. The first valve 206 is arranged between the first restrictor 204 and the pumping module outlet 114.

The first restrictor 204 is configured to restrict a flow of a fluid therethrough.

The first valve 206 is configured to control a flow of fluid therethrough. In particular, in this embodiment, the first valve 206 is configured to be controlled, by the valve controller 118, to selectably permit or prevent a flow of fluid therethrough.

The pumping module 112 further comprises an automatic pressure control (APC) module 208, a turbopump 210, a second valve 212, a third valve 214, a second restrictor 216, and a bypass conduit or line 218.

The APC module 208, the turbopump 210, the second valve 212, the third valve 214, the second restrictor 216, and the bypass line 218 are disposed along the second fluid line 202. The APC module 208 is arranged between the second inlet 110b and the turbopump 210. The turbopump 210 is arranged between the APC module 208 and the third valve 214. The third valve 214 is arranged between the turbopump 210 and the second restrictor 216. The second restrictor 216 is arranged between the third valve 214 and the second valve 212. The bypass line 218 is also arranged between the third valve 214 and the second valve 212, and is in parallel with the second restrictor 216. The second valve 212 is arranged between the second restrictor 216 (and the bypass line 218) and the pumping module outlet 114.

The APC module 208 is configured to control a flow of a fluid therethrough. The APC module 208 may comprise a movable valve with a controller. The valve of the APC module 208 may comprise a moving pendulum controllable by the controller of the APC module 208 to increase or decrease the size of the orifice in the chamber exhaust path. The APC module 208 may receive a pressure setpoint and an actual pressure reading of the pressure inside the process chamber 108. The controller of the APC module 208 may then control the pendulum according to a control algorithm until the actual pressure measurement matches the setpoint. In some embodiments, the valve of the APC module 208 may be controlled by the valve controller 118.

The turbopump 210 is coupled to a respective process chamber 108 via the second inlet 110b. The turbopump 210 is configured to pump exhaust gases from the process chamber 108, through the second fluid line 202, and out of the pumping module outlet 114.

In this embodiment, the third valve 214 is a three-way valve arranged to receive a flow of fluid from the turbopump 210 and selectably direct that flow of fluid through either the second restrictor 216 or the bypass line 218. The third valve 214 is controlled by the valve controller 118.

The second restrictor 216 is configured to restrict a flow of a fluid therethrough.

The bypass line 218 is arranged in parallel with the second restrictor 216, and is arranged to allow a flow of fluid to bypass the second restrictor 216. The bypass line 218 allows a flow of fluid to avoid the second restrictor 216 and flow between the third valve 214 and the second valve 212 relatively unrestricted.

The second valve 212 is configured to control a flow of fluid therethrough. In particular, in this embodiment, the second valve 212 is configured to be controlled, by the valve controller 118, to selectably permit or prevent a flow of fluid therethrough.

Apparatus, including the valve controller 118, for implementing the above arrangement, and performing the method steps to be described below, may be provided by configuring or adapting any suitable apparatus, for example one or more computers or other processing apparatus or processors, and/or providing additional modules. The apparatus may comprise a computer, a network of computers, or one or more processors, for implementing instructions and using data, including instructions and data in the form of a computer program or plurality of computer programs stored in or on a machine-readable storage medium such as computer memory, a computer disk, ROM, PROM etc., or any combination of these or other storage media.

The above-described system may undergo a pump-down event to evacuate gas from one or more of the process chambers 108, which may be at atmospheric pressure, to reduce the pressure therein to a level suitable for a semiconductor fabrication process. The pump-down event may be performed to evacuate gas from a pumping chamber of the turbopump of one or more of the pumping modules.

Figure 3:
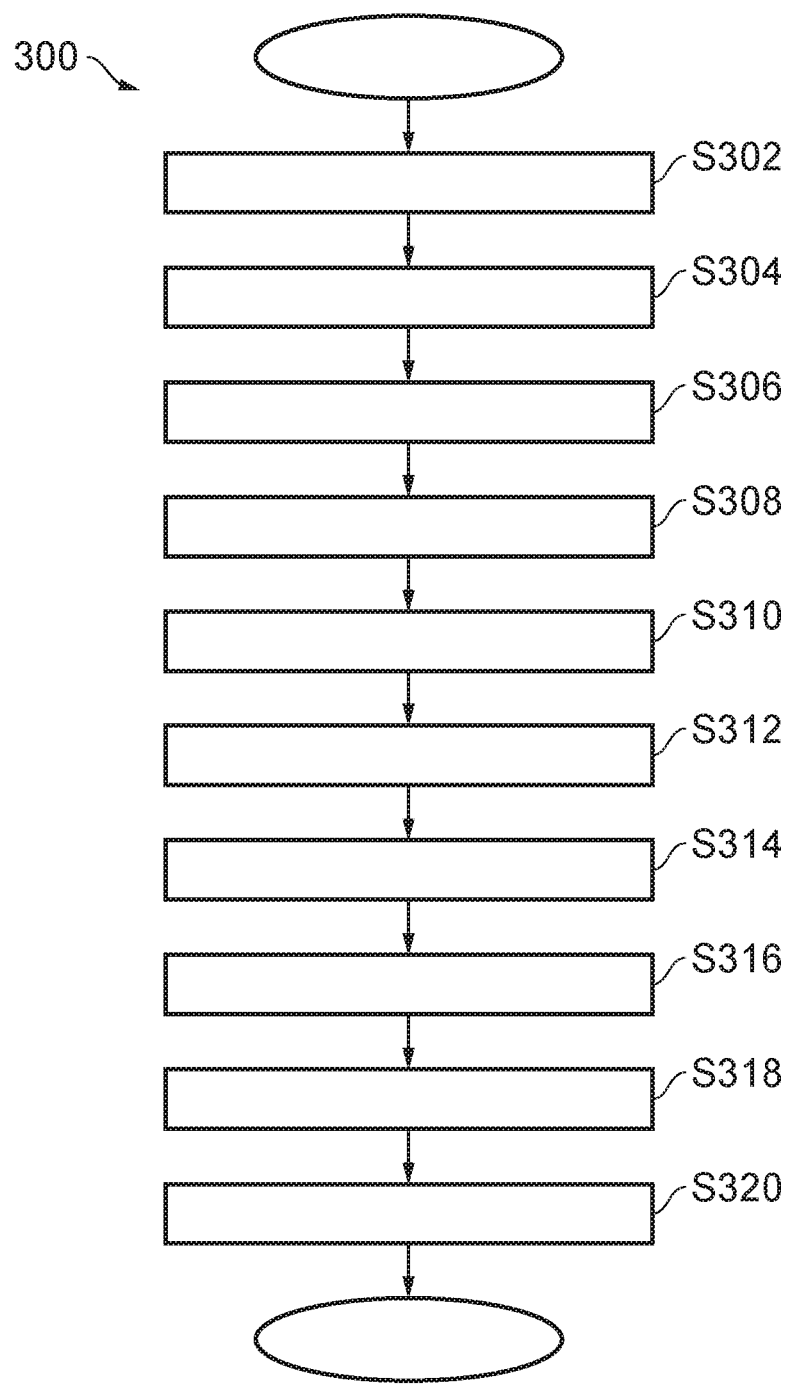
FIG. 3 is a process flow chart showing certain steps of a process of pumping gas in the semiconductor fabrication facility, including a pump-down event.

FIG. 3 is a process flow chart showing certain steps of a process 300 of pumping gas in the semiconductor fabrication facility 100, including a pump down event.

It should be noted that certain of the process steps depicted in the flowchart of FIG. 3 and described below may be omitted or such process steps may be performed in differing order to that presented below and shown in FIG. 3. Furthermore, although all the process steps have, for convenience and ease of understanding, been depicted as discrete temporally-sequential steps, nevertheless some of the process steps may in fact be performed simultaneously or at least overlapping to some extent temporally.

At step s302, semiconductor fabrication processes are performed in the process chambers 108. These semiconductor fabrication processes generate process gases.

In this embodiment, at this stage, for each of the pumping modules 112, the first valves 206 are closed, the second valves 212 are open, and the third valve 214 are configured to directed process gas flow via the bypass lines 218. Thus, at step s302, the vacuum pump 106 pumps process gases out of the process chambers 108 through the relatively unrestricted second fluid lines 202 of the pumping modules 112, and into the fluid line manifold 116.

At step s304, one of the process chambers 108 (hereinafter referred to as "the first process chamber 108" for convenience) is shut down for inspection, servicing, repair, or maintenance. In this embodiment, the shutting down of the first process chamber 108 comprises stopping pumping gas from the first process chamber 108. In this embodiment, this is achieved by closing the first valve 206 and the second valve 212 of the pumping module 112 associated with the first process chamber 108. The turbopump 210 of the pumping module 112 associated with the first process chamber 108 is also shut down. In this embodiment, the shutting down the first process chamber 108 further comprises increasing the pressure in the first process chamber 108 to approximately atmospheric pressure. This may be achieved by opening a valve coupled to the first process chamber 108, thereby allowing air to enter into the first process chamber 108. In addition, in this embodiment, the pressure in the pumping chamber of the turbopump 210 of the pumping module 112 associated with the first process chamber 108 is also increased to approximately atmospheric pressure.

At step s306, a human operator performs an inspection, servicing, repair, or maintenance operation on the first process chamber 108. Alternatively or in addition, inspection, servicing, repair, or maintenance may be performed on one or more components of the pumping module 112 associated with the first process chamber 108.

Following the inspection, servicing, repair, or maintenance operation, a low gas pressure environment is to be re-established in the first process chamber 108 such that semiconductor fabrication processes may be performed therein.

Accordingly, at step s308, the first valve 206 of the pumping module 112 associated with the first process chamber 108 is opened by the valve controller 118.

At step s310, with the first valve 206 open, the vacuum pump 106 pumps gases along the first fluid line 200 from the first process chamber 108 into the fluid line manifold 116.

Thus, the first process chamber 108 is "pumped-down". This gas flow from the first process chamber 108 is restricted by the first restrictor 204 positioned along the first fluid line 200. Advantageously, this flow restriction by the first restrictor 204 tends to reduce or eliminate the pumping-down of the first process chamber 108 detrimentally affecting the conditions within parallel process chambers 108.

At step s312, in response to the pumping down of the first process chamber 108 being completed, the valve controller 118 closes the first valve 206 of the pumping module 112 associated with the first process chamber 108. Also, the valve controller 118 opens the second valve 212 of the pumping module 112 associated with the first process chamber 108. Also, the valve controller 118 controls the third valve 214 of the pumping module 112 associated with the first process chamber 108 such that the third valve 214 directs the flow of fluid through the second restrictor 216, and not through the bypass line 218.

In some embodiments, at step s312, the valve controller 118 may also control the APC module 208 to prevent or oppose a flow of fluid therethrough.

The completion of the pumping down of the first process chamber 108 may be detected by any appropriate means. For example, the valve controller 118 may determine that the pumping-down of the first process chamber 108 is complete in response to a measurement of a pressure within the first process chamber 108 being at or below a first threshold value and/or a calculated rate of decrease of the measured pressure associated with the first process chamber 108 being at or below a second threshold value. The first threshold value may be any appropriate threshold valve. The second threshold value may be any appropriate threshold valve.

At step s314, with the second valve 206 open and the third valve 214 directing fluid flow through the second restrictor 216, the vacuum pump 106 pumps gases along the second fluid line 202 from the pumping chamber of the turbopump 210 into the fluid line manifold 116.

Thus, the pumping chamber of the turbopump 210 is "pumped-down". This gas flow from the pumping chamber of the turbopump 210 is restricted by the second restrictor 216 positioned along the second fluid line 202. Advantageously, this flow restriction by the second restrictor 216 tends to reduce or eliminate the pumping-down of the pumping chamber of the turbopump 210 detrimentally affecting the conditions within parallel process chambers 108.

At step s316, in response to the pumping down of the pumping chamber of the turbopump 210 being completed, the valve controller 118 controls the third valve 214 of the pumping module 112 associated with the first process chamber 108 such that the third valve 214 directs the flow of fluid through the bypass line 218, and not through the second restrictor 216.

In some embodiments, at step s316, the valve controller 118 may also control the APC module 208 to permit a flow of fluid therethrough.

The completion of the pumping down of the pumping chamber of the turbopump 210 may be detected by any appropriate means. For example, the valve controller 118 may determine that the pumping-down of the pumping chamber of the turbopump 210 is complete in response to a measurement of a pressure within the pumping chamber of the turbopump 210 being at or below a third threshold value and/or a calculated rate of decrease of the measured pressure associated with the pumping chamber of the turbopump 210 being at or below a fourth threshold value. The third threshold value may be any appropriate threshold valve. The fourth threshold value may be any appropriate threshold valve.

At step s318, following the third valve 214 of the pumping module 112 associated with the first process chamber 108 being controlled to direct the flow of fluid through the bypass line 218, semiconductor fabrication processes may be performed in the first process chamber 108. These semiconductor fabrication processes generate process gases.

At step s320, the vacuum pump 106 pumps gases out of the first process chamber 108 through the relatively unrestricted second fluid line 202 of the pumping module 112 associated therewith, and into the fluid line manifold 116.

Thus, a process 300 of pumping gas in the semiconductor fabrication facility 100 is provided.

The above-described system and method advantageously tends to reduce or eliminate pump-down events detrimentally affecting the conditions within parallel process chambers. This tends to be achieved by pumping pump-down gases via restrictors, i.e. restricted conduits or reduced diameter orifices.

Advantageously, pump-down events, and the ending of pump-down events, tend to be detected and mitigated against automatically.

Advantageously, the above-described fluid routing module may be integrated in-line with horizontal manifolds connecting the semiconductor processing tool to the vacuum pumps.

Advantageously, the above-described fluid routing module tends to be robust. The vacuum module may be fully assembled, leak checked, and pre-tested, for example, off-site prior to delivery to a semiconductor fabrication facility, or on-site when delivered. This tends to simplify the installation process and reduce installation time.

Advantageously, the above-described fluid routing module tends to be modular and scalable.

Advantageously, the components in the gas streams of the fluid routing module tend to be easy to service, repair or replace.

Advantageously, the status and operating condition of the system tends to be easily monitorable, for example, either via a Human Machine Interface of the valve module or remotely.

Advantageously, each fluid routing module in a system tends to be easily controllable by a system controller, for example using a communication protocol such as EtherCAT or ethernet.

Advantageously, the above-described fluid routing module allows for multiple mounting options. For example, the fluid routing module may be suspended from a ceiling of a semiconductor fabrication facility, which provides a benefit of not consuming floor space. Alternatively, the fluid routing module can be mounted in a floor-standing rack or on top of other equipment.

In the above embodiments, the fluid routing module is implemented in a semiconductor fabrication facility for routing pumped process gases. However, in other embodiments, the fluid routing module may be implemented in a different system and be used for routing a different type of fluid.

In the above embodiments, there is a single semiconductor processing tool which comprises six process chambers. However, in other embodiments, there is more than one semiconductor processing tool. One or more of the semiconductor processing tools may comprise a different number of process chambers, other than six.

In the above embodiments, there is a single fluid routing module comprising six pumping modules. However, in other embodiments, there may be a different number of fluid routing modules, i.e. multiple fluid routing modules. In some embodiments, one or more of the fluid routing modules may comprise a different number of pumping modules other than six.

In the above embodiments, a pumping module comprises two inlets connected to a single outlet. However, in other embodiments, one or more of the pumping modules comprises a different number of inlets (other than two) and a different number of outlets (other than one).

In the above embodiments, each pumping modules comprises a first valve, a second valve, and a third valve configured to provide the above-described functionality. However, in other embodiments, one or more of the pumping modules may comprise a different arrangement or configuration of valves providing the above-described functionality. For example, in some embodiments, one or more of the pumping modules, the first and second valves of that pumping module may be replaced by a three-way valve disposed at the junction of the first fluid line, the second fluid line, and the pumping module outlet. This three-way vale may be configured to direct fluid into the pumping module outlet from a selected one of the first fluid line and the second fluid line, and to prevent or oppose fluid flow into the pumping module outlet from the other of the first fluid line and the second fluid line. Also, for example, in some embodiments, the third valve may be replaced by one or more valves disposed along the bypass line.

In some embodiments, the APC module may be omitted or replaced by one or more valves.

Although elements have been shown or described as separate embodiments above, portions of each embodiment may be combined with all or part of other embodiments described above.

Although the subject matter has been described in language specific to structural features and/or methodological acts, it is to be understood that the subject matter defined in the appended claims is not necessarily limited to the specific features or acts described above. Rather, the specific features and acts described above are described as example forms of implementing the claims.

The invention claimed is:

1. A fluid routing module for a vacuum pumping system, the fluid routing module comprising:
   a first fluid inlet;
   a second fluid inlet;
   a fluid outlet;
   a first fluid line coupled between the first fluid inlet and the fluid outlet;
   a second fluid line coupled between the second fluid inlet and the fluid outlet;
   a first restrictor configured to restrict a flow of the fluid therethrough, the first restrictor being disposed along the first fluid line;
   a vacuum pump disposed along the second fluid line; and
   one or more valves configured to selectably direct a fluid flow through either the first fluid line or the second fluid line;
   a second restrictor configured to restrict a flow of the fluid therethrough, the second restrictor being disposed along the second fluid line;
   a bypass line arranged in parallel with the second restrictor whereby to allow a flow of fluid to bypass the second restrictor; and
   one or more further valves configured to selectably direct a fluid flow through either the second restrictor or the bypass line.

2. The fluid routing module of claim 1, wherein:
   the one or more valves comprises:
   a first valve; and
   a second valve;
   the first valve is disposed along the first fluid line; and
   the second valve is disposed along the second fluid line.

3. The fluid routing module of claim 1, wherein the second restrictor and the bypass line are disposed along the second fluid line between the vacuum pump and the fluid outlet.

4. The fluid routing module of claim 1, wherein the one or more further valves comprises a three-way valve disposed between the vacuum pump and the second restrictor and the bypass line.

5. The fluid routing module of claim 1, wherein the vacuum pump is a turbopump.

6. The fluid routing module of claim 1, further comprising a valve controller configured to control operation of the one or more valves.

7. The fluid routing module of claim 1, further comprising:
   one or more further first fluid inlet;
   one or more further second fluid inlets;
   one or more further fluid outlets;
   one or more further first fluid lines, each further first fluid line coupled between a respective further first fluid inlet and a further fluid outlet;
   one or more further second fluid lines, each further second fluid line coupled between a respective second fluid inlet and a further fluid outlet;
   one or more further first restrictors configured to restrict a flow of the fluid therethrough, each further first restrictor being disposed along a respective further first fluid line;
   one or more further vacuum pumps, each further vacuum pump being disposed along a respective further second fluid line; and
   one or more further valves configured to selectably direct a fluid flow through either a further first fluid line or a further second fluid line.

8. The fluid routing module of claim 7, further comprising a fluid line manifold, wherein the fluid outlet and the one or more further fluid outlets are fluidly coupled to the fluid line manifold.

9. A system comprising:
   a semiconductor processing tool comprising a processing chamber;
   the fluid routing module of claim 1, wherein the first fluid inlet and the second fluid inlet are fluidly coupled to the processing chamber; and
   a pump operatively coupled to the fluid outlet.

10. The system of claim 9, wherein:
    the semiconductor processing tool further comprises one or more further processing chambers;
    the system further comprises one or more further fluid routing modules, each further fluid routing modules being a fluid routing module in accordance with claim 1, wherein the first fluid inlet and the second fluid inlet of each further fluid routing module are fluidly coupled to a respective further processing chamber;
    the system further comprises a fluid line manifold, wherein the fluid outlet of the fluid routing module and each of the fluid routing modules are fluidly coupled to the fluid line manifold; and
    the pump is operatively coupled to the fluid line manifold.

11. A method for operating a fluid routing module for a vacuum pumping system, the fluid routing module being in accordance with claim 1, the method comprising:
    controlling the one or more valves to direct a fluid flow through the first fluid line and to prevent or oppose fluid flow through the second fluid line; and, responsive to one or more conditions being satisfied, controlling the one or more valves to allow a fluid flow through the second fluid line and to prevent or oppose fluid flow through the first fluid line, and pumping, by the vacuum pump, the fluid through the second fluid line.

12. The method of claim 11, wherein the one or more conditions comprises a condition that a pressure in a chamber fluidly coupled to the first fluid input and the second fluid inlet is below a first threshold pressure.

13. The method of claim 11, wherein:
the method further comprises:
controlling the one or more further valves to direct a fluid flow through the second restrictor and to prevent or oppose fluid flow through the bypass line; and,
responsive to one or more further conditions being satisfied, controlling the one or more further valves to allow a fluid flow through the bypass line and to prevent or oppose fluid flow through the second restrictor.

14. The method of claim 13, wherein the one or more further conditions comprises a condition that a pressure in a pumping chamber of the vacuum pump is below a second threshold pressure.

* * * * *